(12) United States Patent
Yang (10) Patent No.: US 11,325,351 B2
(45) Date of Patent: May 10, 2022

(54) METHOD FOR FABRICATING DISPLAY PANEL

(71) Applicant: Wuhan China Star Optoelectronics Semiconductor Display Technology Co., Ltd., Wuhan (CN)

(72) Inventor: Hanning Yang, Wuhan (CN)

(73) Assignee: Wshan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 122 days.

(21) Appl. No.: 16/605,212

(22) PCT Filed: Sep. 6, 2019

(86) PCT No.: PCT/CN2019/104743
§ 371 (c)(1),
(2) Date: Oct. 15, 2019

(87) PCT Pub. No.: WO2020/228196
PCT Pub. Date: Nov. 19, 2020

(65) Prior Publication Data
US 2020/0361197 A1 Nov. 19, 2020

(30) Foreign Application Priority Data
May 16, 2019 (CN) .......................... 201910404702.9

(51) Int. Cl.
*B05D 3/00* (2006.01)
*B05D 3/06* (2006.01)
(Continued)

(52) U.S. Cl.
CPC .............. *B32B 17/10* (2013.01); *B05D 3/007* (2013.01); *B05D 3/06* (2013.01); *B05D 3/065* (2013.01);
(Continued)

(58) Field of Classification Search
CPC .......... B05D 3/007; B05D 3/06; B05D 3/065; B05D 2505/50; B05D 2701/30;
(Continued)

(56) References Cited

U.S. PATENT DOCUMENTS 10,744,737 B2 * 8/2020 Liu .......................... B32B 3/08
2017/0240707 A1 8/2017 Katayama et al.
(Continued)

FOREIGN PATENT DOCUMENTS

CN 104380366 2/2015
CN 107086010 8/2017
(Continued)

OTHER PUBLICATIONS

English-language machine translation of the International Search Report for PCT/CN2019/104743, dated Nov. 19, 2020, generated Sep. 30, 2021. (Year: 2020).*

*Primary Examiner* — William P Fletcher, III (57) ABSTRACT

A method for fabricating a display panel including a bending area includes: providing a substrate; forming a first flexible layer on the substrate; forming an organic layer on the first flexible layer, wherein a wavelength of light absorbed by the organic layer is different from a wavelength of light absorbed by the first flexible layer; irradiating a part of the organic layer in the bending area with a laser to make at least a portion of the part of the organic layer a carbonized layer, thereby forming a spacer layer; forming a second flexible layer covering the first flexible layer and the spacer layer, wherein the first flexible layer and the second flexible layer are made of a same material and separated by the spacer layer; and cutting a part of the substrate and a part of the first flexible layer in the bending area.

13 Claims, 7 Drawing Sheets

(51) Int. Cl.
*B32B 17/10* (2006.01)
*B32B 38/14* (2006.01)
*B32B 38/00* (2006.01)
*B32B 27/36* (2006.01)
*B32B 38/10* (2006.01)
*B32B 43/00* (2006.01)
*B32B 37/24* (2006.01)
*B32B 37/02* (2006.01)
*B32B 1/00* (2006.01)
*B29C 63/00* (2006.01)
*H01L 51/00* (2006.01)
*H01L 51/52* (2006.01)

(52) U.S. Cl.
CPC ............ *B29C 63/0013* (2013.01); *B32B 1/00* (2013.01); *B32B 27/36* (2013.01); *B32B 37/02* (2013.01); *B32B 37/24* (2013.01); *B32B 38/0004* (2013.01); *B32B 38/0008* (2013.01); *B32B 38/0012* (2013.01); *B32B 38/10* (2013.01); *B32B 38/14* (2013.01); *B32B 43/006* (2013.01); *H01L 51/0097* (2013.01); B05D 2505/50 (2013.01); B05D 2701/30 (2013.01); B32B 2037/243 (2013.01); B32B 2037/246 (2013.01); B32B 2255/10 (2013.01); B32B 2255/26 (2013.01); B32B 2307/748 (2013.01); B32B 2310/0843 (2013.01); B32B 2379/08 (2013.01); B32B 2457/206 (2013.01); H01L 51/5284 (2013.01)

(58) Field of Classification Search
CPC . H01L 21/461; H01L 21/463; H01L 51/0014; H01L 51/0024; H01L 51/0097; H01L 51/50; H01L 51/52; H01L 51/5284; H01L 51/56
See application file for complete search history.

(56) References Cited

U.S. PATENT DOCUMENTS

| | | | |
|---|---|---|---|
| 2019/0109181 A1* | 4/2019 | Chung | H01L 51/0031 |
| 2019/0148654 A1* | 5/2019 | Hasegawa | B32B 27/285 |
| | | | 257/40 |
| 2020/0136080 A1* | 4/2020 | Gu | H01L 51/56 |

FOREIGN PATENT DOCUMENTS

| | | | |
|---|---|---|---|
| CN | 108777112 | | 11/2018 |
| CN | 108777112 A | * | 11/2018 |
| CN | 108962937 | | 12/2018 |
| CN | 108962937 A | * | 12/2018 |
| CN | 109215511 | | 1/2019 |
| CN | 109360845 | | 2/2019 |
| CN | 109638156 | | 4/2019 |
| CN | 109659318 | | 4/2019 |
| CN | 110176184 | | 8/2019 |
| CN | 110176184 A | * | 8/2019 |
| KR | 10-2018-0003684 | | 1/2018 |
| KR | 20180003684 A | * | 1/2018 |

\* cited by examiner

METHOD FOR FABRICATING DISPLAY PANEL

RELATED APPLICATIONS

This application is a National Phase of PCT Patent Application No. PCT/CN2019/104743 having International filing date of Sep. 6, 2019, which claims the benefit of priority of Chinese Patent Application No. 201910404702.9 filed on May 16, 2019. The contents of the above applications are all incorporated by reference as if fully set forth herein in their entirety.

FIELD AND BACKGROUND OF THE INVENTION

The present disclosure relates to a field of display technology, and particularly to a display panel and a method for fabricating the same.

With development of technology, people's demand for narrow frame products has been gradually increased. Recently, width of a lower frame of a display panel can be effectively reduced by bending a bonding area. However, in a display panel, metal traces are easily damaged by stress when a bending radius of a bonding area is small.

SUMMARY OF THE INVENTION

The present disclosure provides a display panel and a method for fabricating the same to solve the technical problem that metal traces are easily damaged by stress when a bending radius of a bonding area of a current display panel is small.

The present disclosure provides a method for fabricating a display panel, comprising:

providing a substrate comprising a first setting area, wherein the first setting area is configured to set a bending area;

forming a first flexible layer on the substrate;

forming an organic layer on the first flexible layer;

irradiating the organic layer in the first setting area with a laser to make at least a portion of the organic layer a carbonized layer, thereby forming a spacer layer covering at least the first setting area;

forming a second flexible layer on the first flexible layer, wherein the second flexible layer covers the spacer layer, materials of the first flexible layer and the second flexible layer are the same, and the spacer layer spaces the first flexible layer and the second flexible layer; and cutting the substrate and the first flexible layer in the first setting area.

In an embodiment, wavelength of light absorbed by the organic layer is different from wavelength of light absorbed by the first flexible layer.

In an embodiment, the spacer layer comprises the carbonized layer formed by oxidizing the organic layer by irradiating light.

In an embodiment, a material of the organic layer is doped with dyes and/or nanoparticles having strong absorption of light having a wavelength greater than 500 nm and is an easily oxidizable organic material, and a material of the first flexible layer is polyimide.

In an embodiment, the organic layer covers the entire first flexible layer, or the organic layer covers the first flexible layer in the first setting area.

In an embodiment, the cutting the substrate and the first flexible layer in the first setting area comprises:

cutting and peeling off the substrate in the first setting area; and cutting and peeling off the first flexible layer in the first setting area.

The present disclosure further provides a method for fabricating a display panel, comprising:

providing a substrate comprising a first setting area, wherein the first setting area is configured to set a bending area;

forming a first flexible layer on the substrate;

forming a spacer layer on the first flexible layer, wherein the spacer layer covers at least the first setting area;

forming a second flexible layer on the first flexible layer, wherein the second flexible layer covers the spacer layer; and cutting the substrate and the first flexible layer in the first setting area.

In an embodiment, the forming a spacer layer on the first flexible layer comprises:

forming an organic layer on the first flexible layer; and irradiating the organic layer in the first setting area with a laser to make at least a portion of the organic layer a carbonized layer, thereby separating the first flexible layer and the second flexible layer.

In an embodiment, wavelength of light absorbed by the organic layer is different from wavelength of light absorbed by the first flexible layer.

In an embodiment, the spacer layer comprises the carbonized layer formed by oxidizing the organic layer by irradiating light.

In an embodiment, a material of the organic layer is doped with dyes and/or nanoparticles having strong absorption of light having a wavelength greater than 500 nm and is an easily oxidizable organic material, and a material of the first flexible layer is polyimide.

In an embodiment, materials of the first flexible layer and the second flexible layer are the same.

In an embodiment, a thickness of the carbonized layer is greater than or equal to 100 nm and less than or equal to 1 mm.

In an embodiment, the organic layer covers the entire first flexible layer, or the organic layer covers the first flexible layer in the first setting area.

In an embodiment, the spacer layer is a release film, and the release film covers the first flexible layer in the first setting area.

In an embodiment, the cutting the substrate and the first flexible layer in the first setting area comprises:

cutting and peeling off the substrate in the first setting area; and cutting and peeling off the first flexible layer in the first setting area.

In an embodiment, the cutting the substrate and the first flexible layer in the first setting area comprises:

cutting and peeling off cut-out portions, wherein the cut-out portions are the substrate and the first flexible layer in the first setting area.

In an embodiment, the substrate and the first flexible layer in the first setting area are cut with an ultraviolet laser at ends thereof.

In an embodiment, the substrate further comprises a second setting area and a third setting area. The second setting area is configured to set a display area. The third setting area is configured to set a bonding area. The first setting area is located between the second setting area and the third setting area.

In an embodiment, before the step of cutting the substrate and the first flexible layer in the first setting area, the method further comprises:

forming the display area, the bending area, and the bonding area on the second flexible layer.

The present disclosure further provides a display panel comprising a substrate structure;

wherein the substrate structure comprises:
- a first setting area configured to set a bending area for bending;
- a second setting area configured to set a display area; and
- a third setting area configured to set a bonding area; and wherein the substrate structure further comprises:
- a substrate comprising a first hollow portion, wherein the first hollow portion is correspondingly disposed in the first setting area;
- a first flexible layer disposed on the substrate, wherein the first flexible layer comprises a second hollow portion correspondingly disposed in the first setting area;
- a second flexible layer disposed on the first flexible layer; and
- a spacer layer disposed between the first flexible layer and the second flexible layer, wherein at least a portion of the spacer structure layer is correspondingly disposed in the first setting area and exposed.

In an embodiment, the spacer layer comprises an organic layer and a carbonized layer formed on the organic layer and adjacent to the first flexible layer, and the carbonized layer needs to be peeled off before the display panel is bent.

In an embodiment, the spacer layer is a release film.

In the methods for fabricating the display panel according to the present disclosure, the first flexible layer and the second flexible layer are spaced apart by disposing the spacer layer between the first flexible layer and the second flexible layer. Further, the substrate and the first flexible layer in the first setting area are cut, thereby thinning a thickness of a flexible base substrate in the first setting area. The method solves the technical problem that metal traces are easily damaged by stress when a bending radius of a bonding area of a current display panel is small.

BRIEF DESCRIPTION OF THE SEVERAL VIEWS OF THE DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Please refer to the accompanying drawings, in which the same reference numerals represent the same components. The following description is based on the specific embodiments of the present disclosure, and should not be construed as limiting other embodiments that are not described herein.

The present disclosure provides a method for fabricating a display panel. The display panel comprises a display area A, a bending area B, and a bonding area C. A substrate 11 comprises a first setting area b, a second setting area a, and a third setting area c. The first setting area b is used to set the bending area B. The second setting area a is used to set the display area A. The third setting area c is used to set the bonding area C. The first setting area b is located between the second setting area a and the third setting area c. The bending area B comprises an insulating layer, a metal trace b1, and a protective layer which are sequentially disposed on a second flexible layer 14.

The method for fabricating the display panel comprises:

S11: providing the substrate 11;

S12: forming a first flexible layer 12 on the substrate 11;

S13: forming a spacer layer 13 on the first flexible layer 12, wherein the spacer layer 13 covers at least the first setting area b;

S14: forming the second flexible layer 14 on the first flexible layer 12, wherein the second flexible layer 14 covers the spacer layer 13;

S15: forming the display area A, the bending area B, and the bonding area C on the second flexible layer 14; and S16: cutting the substrate 11 and the first flexible layer 12 in the first setting area b.

In the method for fabricating the display panel, the laminated structure of the first flexible layer 12, the spacer layer 13, and the second flexible layer 14 is equivalent to a flexible base substrate of the prior art.

Figure 1:
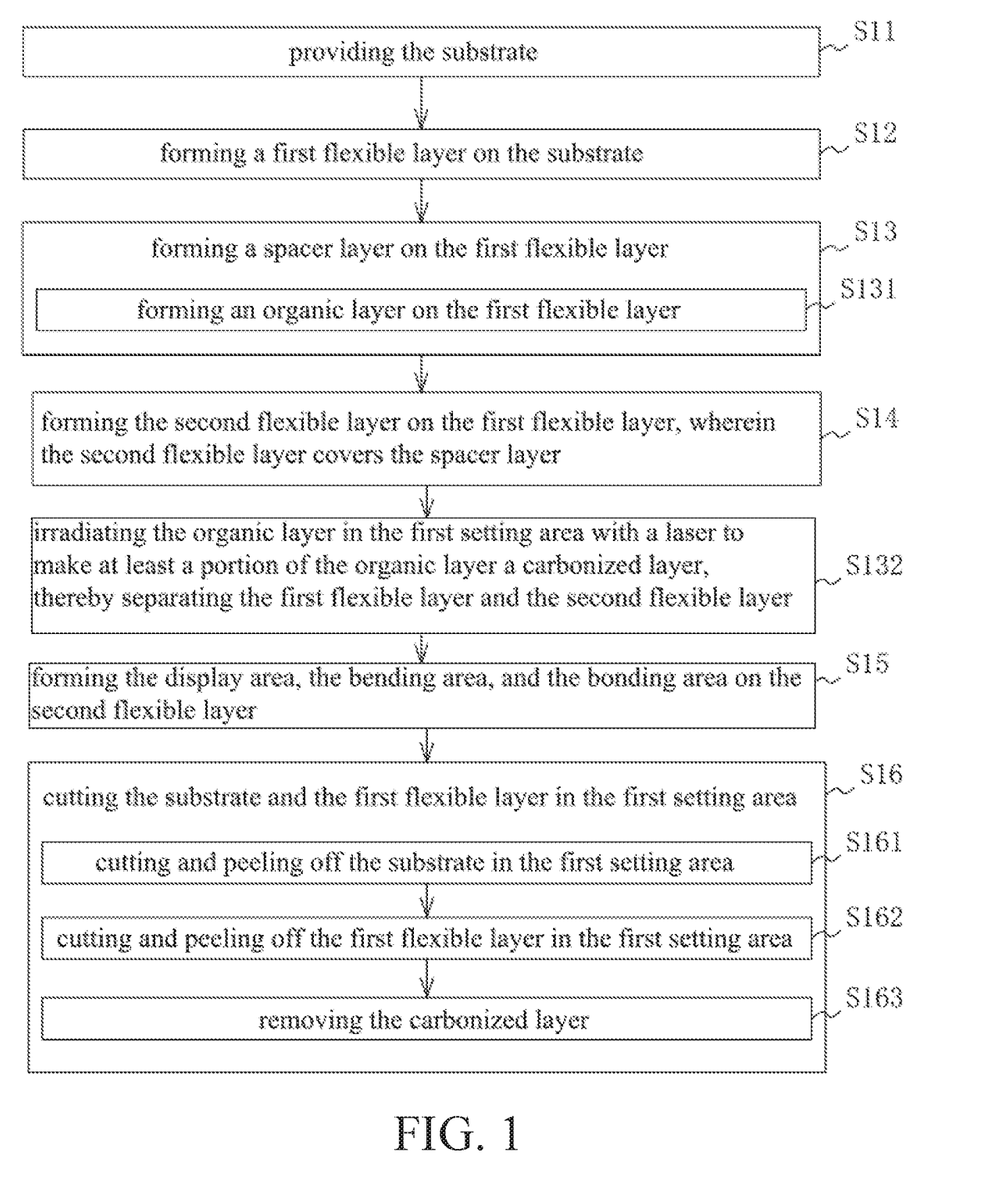
FIG. 1 is a flowchart of a method for fabricating a display panel according to a first embodiment of the present disclosure.
Figure 2:
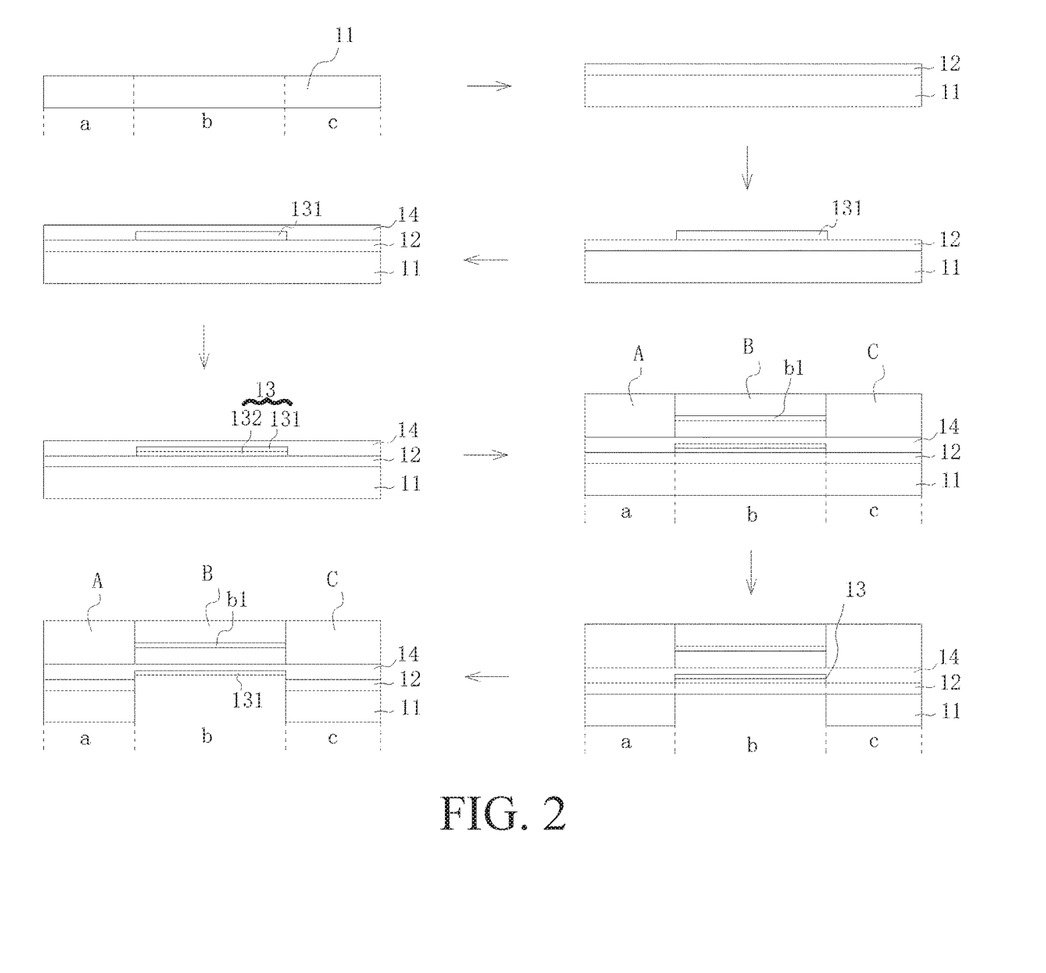
FIG. 2 is another flowchart of a method for fabricating a display panel according to a first embodiment of the present disclosure.

Please refer to FIG. 1 and FIG. 2. FIG. 1 is a flowchart of a method for fabricating a display panel according to a first embodiment of the present disclosure. FIG. 2 is another flowchart of a method for fabricating a display panel according to a first embodiment of the present disclosure.

A method for fabricating a display panel according to a first embodiment of the present disclosure comprises the following steps. S11: providing the substrate 11. The substrate 11 may be a flexible substrate or a rigid substrate. For example, the substrate 11 may be a polyethylene terephthalate substrate or a glass substrate but is not limited thereto. The substrate 11 serves as a support and provides a flat base for facilitating subsequent steps. The method then proceeds to step S12.

S12: forming a first flexible layer 12 on the substrate 11.

Specifically, the first flexible layer 12 is formed by a process such as a coating method, evaporation deposition, and chemical vapor deposition. Optionally, the first flexible layer 12 is composed of polyimide or other transparent flexible material. A material of the first flexible layer 12 can absorb light of a specific wavelength different from light absorbed by an organic layer 131 in the next step. The method then proceeds to step S13.

S13: forming a spacer layer 13 on the first flexible layer 12, wherein the spacer layer 13 covers at least the first setting area b.

Specifically, the forming a spacer layer 13 on the first flexible layer 12 comprises:

S131: forming an organic layer 131 on the first flexible layer 12; and

S132: irradiating the organic layer 131 in the first setting area b with a laser to make at least a portion of the organic layer 131 a carbonized layer 132, thereby separating the first flexible layer 12 and the second flexible layer 14.

S131: forming an organic layer 131 on the first flexible layer 12.

The organic layer 131 may be formed by a process such as a coating method, evaporation deposition, and inkjet printing. In the first embodiment, the organic layer 131 only covers the first flexible layer 12 in the first setting area b. In some embodiments, the organic layer 131 covers the entire first flexible layer 12. In addition, roughness of the display panel in the first setting area b can be effectively reduced by controlling flatness of the organic layer 131. The method then proceeds to step S14.

S132: irradiating the organic layer 131 in the first setting area b with a laser to make at least a portion of the organic layer 131 a carbonized layer 132, thereby separating the first flexible layer 12 and the second flexible layer 14. Step S132 is after step S14. After step S132 is completed, the method then proceeds to step S15.

A wavelength of light absorbed by the organic layer 131 is different from the wavelength of light absorbed by the first flexible layer 12. Therefore, in step S132, under the irradiation of the laser of a specific wavelength, only the organic layer 131 is carbonized and neither the first flexible layer 12 nor the second flexible layer 14 is carbonized.

Specifically, the spacer layer 13 comprises the carbonized layer 132 formed by oxidizing the organic layer by irradiating light of a specific wavelength.

Furthermore, a material of the organic layer 131 is doped with dyes and/or nanoparticles having strong absorption of light having a wavelength greater than 500 nm and is an easily oxidizable organic material. Therefore, the organic layer 131 can absorb light of a wavelength of 500 nm or more and then be oxidized to the carbonized layer 132. The material of the first flexible layer 12 is polyimide so that it easily absorbs light of a wavelength of 500 nm or less and is thus oxidized. Therefore, when the organic layer 131 is irradiated with a laser of a wavelength of 500 nm or more, the carbonized layer 132 is formed on a surface of the organic layer 131 facing the laser, and the first flexible layer 12 and the second flexible layer 14 are not carbonized.

The formation of the carbonized layer 132 causes the second flexible layer 14 and the first flexible layer 12 to be unconnected. The second flexible layer 14 and the first flexible layer 12 in the areas other than the first setting area b are operatively connected.

A thickness of the carbonized layer 132 is greater than or equal to 100 nm and less than or equal to 1 mm. When the thickness of the carbonized layer 132 is less than 100 nm, the carbonized layer 132 cannot reach an effect of spacing the organic layer 131 and the first flexible layer 12. When the thickness of the carbonized layer 132 is more than 1 mm, laser energy required to form the carbonized layer 132 is large and efficiency is lowered. The method then proceeds to step S14.

S14: forming the second flexible layer 14 on the first flexible layer 12, wherein the second flexible layer 14 covers the spacer layer 13.

Specifically, the second flexible layer 14 is formed by a process such as a coating method, evaporation deposition, and chemical vapor deposition. Optionally, materials of the first flexible layer 12 and the second flexible layer 14 are the same. The second flexible layer 14 covers the organic layer 131 and covers the first flexible layer 12 outside the organic layer 131. This facilitates a connection of the first flexible layer 12 and the second flexible layer 14.

Optionally, the second flexible layer 14 is composed of polyimide or other transparent flexible material. A material of the second flexible layer 14 can absorb light of a specific wavelength. The method then proceeds to step S132.

S15: forming the display area A, the bending area B, and the bonding area C on the second flexible layer 14.

S16: cutting the substrate 11 and the first flexible layer 12 in the first setting area b.

Specifically, step S16 comprises:

S161: cutting and peeling off the substrate 11 in the first setting area b;

S162: cutting and peeling off the first flexible layer 12 in the first setting area b; and S163: removing the carbonized layer 132.

In some embodiments, step S16 may be: cutting and peeling off cut-out portions, wherein the cut-out portions are the substrate 11 and the first flexible layer 12 in the first setting area b.

In step S16 of the first embodiment, the substrate 11, the first flexible layer 12 and the carbonized layer 132 in the first setting area b are gradually cut off in three steps, so that cutting precision can be controlled.

In step S16, the substrate and the first flexible layer in the first setting area are cut with an ultraviolet laser at ends thereof.

In the first embodiment, the substrate 11, the first flexible layer 12, and the carbonized layer 132 in the first setting area b are peeled off to thin the thickness of the flexible base substrate disposed below the bending area B. The flexible base substrate comprises a first flexible layer 12, an organic layer 131, a carbonized layer 132, and a second flexible layer 14.

Positions of the organic layer 131 and the carbonized layer 132 can be adjusted by adjusting thicknesses of the first flexible layer 12 and the second flexible layer 14, thereby controlling a degree of thinning of the flexible base substrate. Furthermore, by thinning the flexible base substrate disposed below the bending area B, that is, by cutting the first flexible layer 12 and the carbonized layer 132 disposed below the first setting area b, a bending neutral layer of the bending area B is adjusted to a same layer as the metal trace b1 or above the metal trace b1. Therefore, when the bending area B is bent, the metal trace b1 can be prevented from being damaged.

Thus, the method for fabricating the display panel according to the first embodiment is completed.

Figure 3:
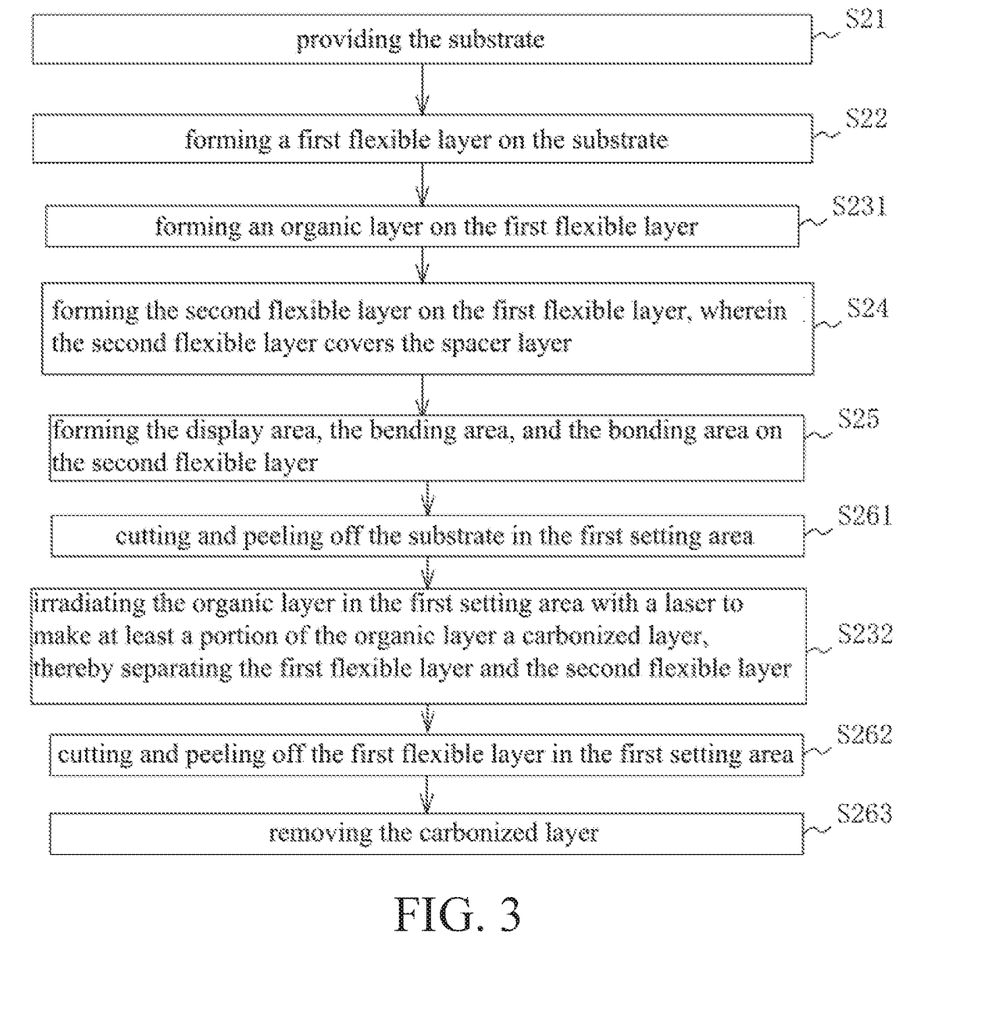
FIG. 3 is a flowchart of a method for fabricating a display panel according to a second embodiment of the present disclosure.
Figure 4:
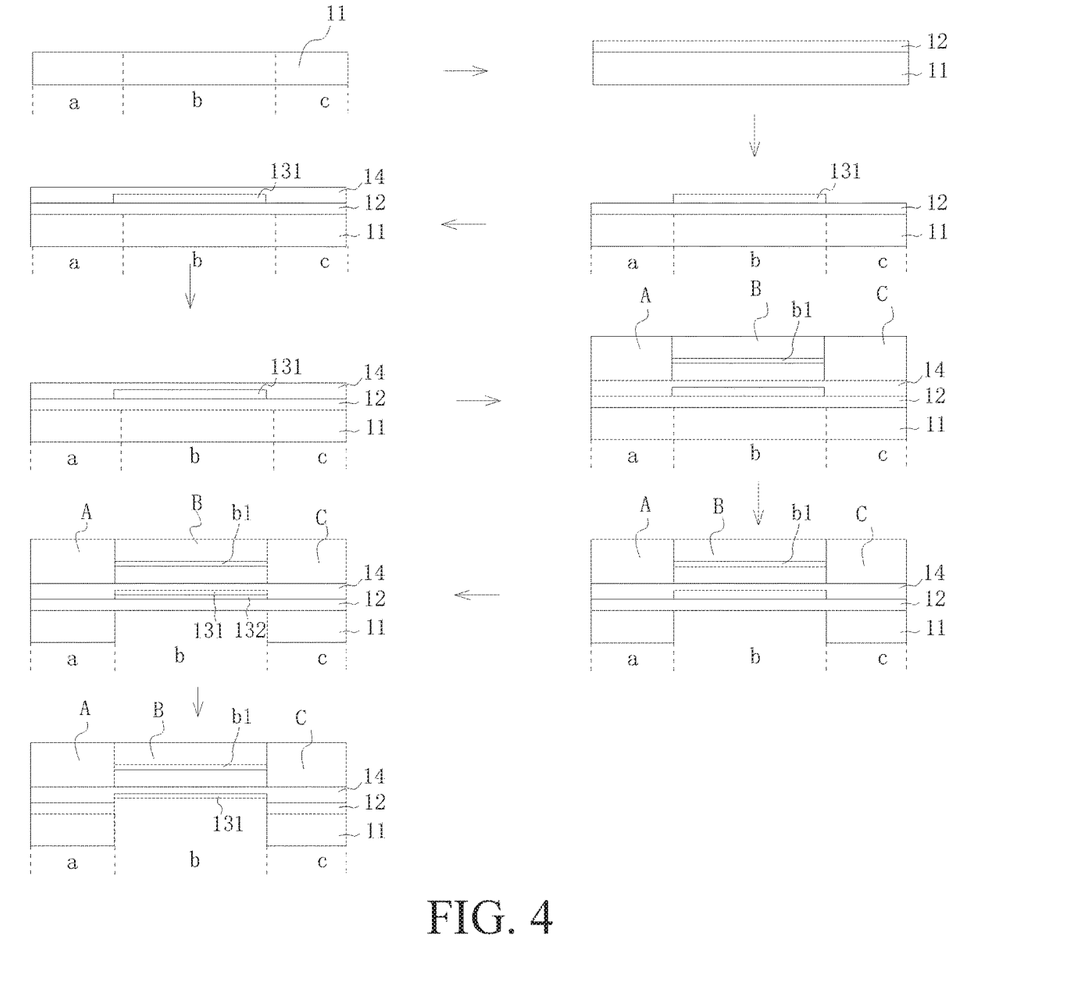
FIG. 4 is another flowchart of a method for fabricating a display panel according to a second embodiment of the present disclosure.

Please refer to FIG. 3 and FIG. 4. FIG. 3 is a flowchart of a method for fabricating a display panel according to a second embodiment of the present disclosure. FIG. 4 is another flowchart of a method for fabricating a display panel according to a second embodiment of the present disclosure. In FIG. 4 of the second embodiment and FIG. 2, the same reference numerals represent the same components.

A method for fabricating a display panel of the second embodiment differs from that of the first embodiment in that step S232 is after step S261 and before step S262.

That is, after step S231, steps S24, S25, S261, S232, S262, and S263 are sequentially performed.

Specifically, after step S231, step S232 is not directly performed to avoid affecting support balance of the entire flexible base substrate, thereby making the subsequently formed layers flatter. Furthermore, step S232 is set after step S261, thereby determining an actual range of the first setting area b to function as a mark, and thereby reducing a partial thickness of the actual range to facilitate direct laser irradiation in the subsequent step S232. Therefore, laser energy and irradiation time are saved, and efficiency of the formation of the carbonized layer 232 is improved.

Figure 5:
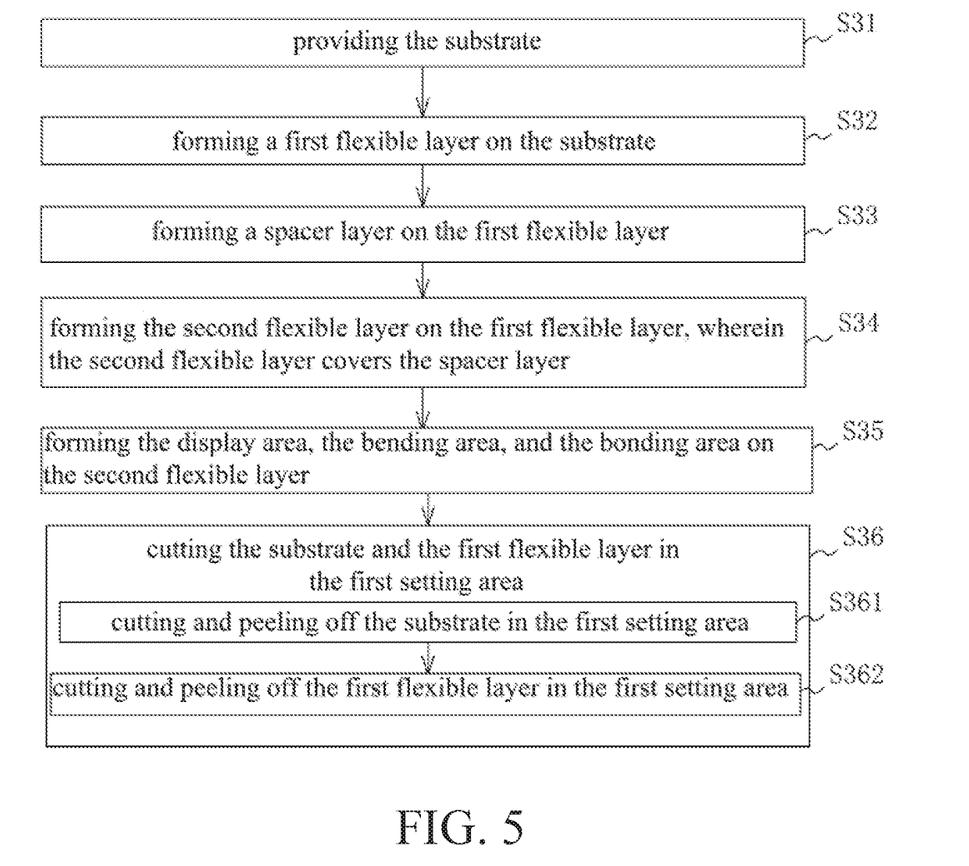
FIG. 5 is a flowchart of a method for fabricating a display panel according to a third embodiment of the present disclosure.

Please refer to FIG. 5, which is a flowchart of a method for fabricating a display panel according to a third embodiment of the present disclosure. A method for fabricating a display panel of the third embodiment differs from that of the first embodiment in that the spacer layer 13 is a release film covering the first flexible layer 12 in the first setting area b.

In step S33 of the third embodiment, the spacer layer 13 is directly formed without first forming an organic layer 131 and a carbonized layer 132. In step 36, only the substrate 11 and the first flexible layer 12 in the first setting area b are cut, and the release film is not removed.

The use of a release film instead of a carbonized layer saves the step of laser irradiation, thereby increasing efficiency.

Figure 6:
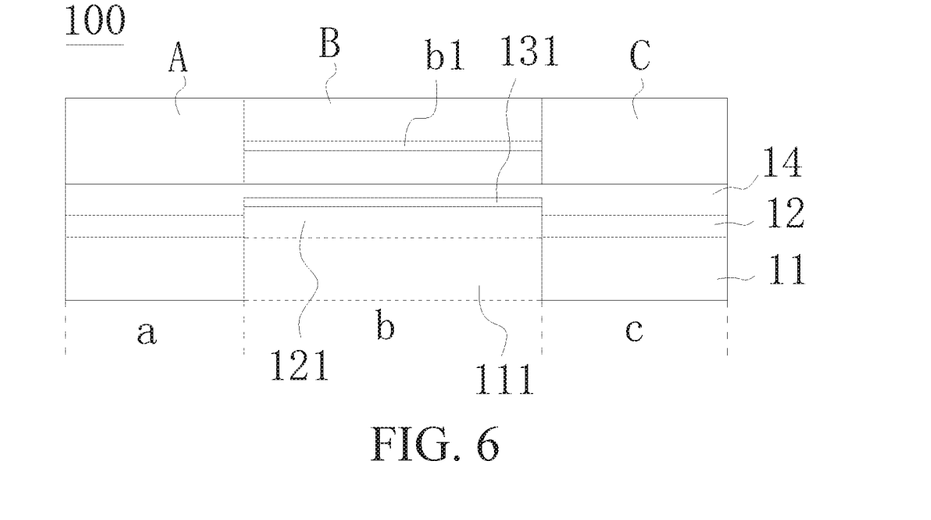
FIG. 6 is a cross-sectional side view of a display panel according to a first embodiment of the present disclosure.
Figure 7:
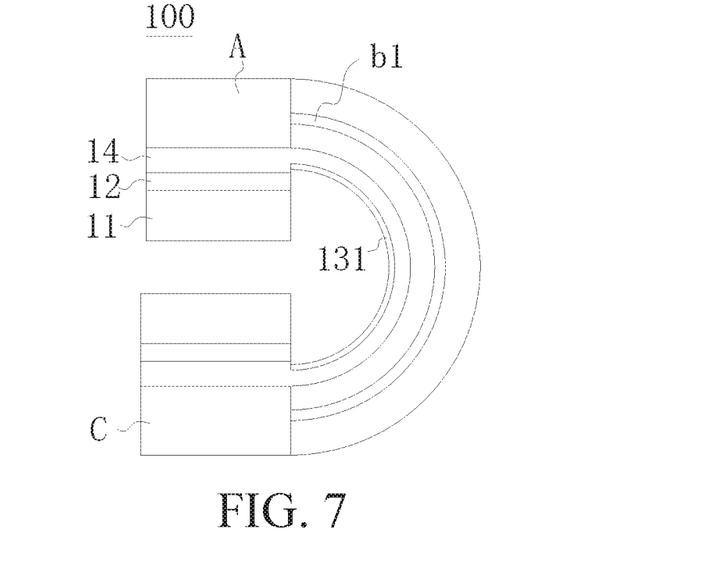
FIG. 7 is another cross-sectional side view of a display panel according to a first embodiment of the present disclosure.

Please refer to FIG. 6 and FIG. 7. FIG. 6 is a cross-sectional side view of a display panel according to a first embodiment of the present disclosure. FIG. 7 is another cross-sectional side view of a display panel according to a first embodiment of the present disclosure. In the first embodiment of the present disclosure, a display panel 100 comprises a substrate structure comprising a first setting area b, a second setting area a, and a third setting area c. The first setting area b is used to set a bending area B. The second setting area a is used to set a display area A. The third setting area c is used to set a bonding area C.

The substrate structure comprises a substrate 11, a first flexible layer 12, a second flexible layer 14, and a spacer layer.

The substrate 11 comprises a first hollow portion 111 in the first setting area b.

The first flexible layer 12 is disposed on the substrate 11. The first flexible layer 12 comprises a second hollow portion 121 in the first setting area b. The second flexible layer 14 is disposed on the first flexible layer 12.

The spacer layer is disposed between the first flexible layer 12 and the second flexible layer 14. At least a portion of the spacer layer is disposed in the first setting area b and exposed.

In the first embodiment, the spacer layer only disposed in the first setting area b. With such an arrangement, when laser irradiation is performed, laser scanning range can be omitted, that is, the laser can scan the entire panel. Since the organic layer 131 is only disposed in the first setting area b for setting the bending area B, only the organic layer 131 in this area is carbonized.

Specifically, the spacer layer comprises an organic layer 131 and a carbonized layer formed on a surface of the organic layer 131 close to the first flexible layer 12. It should be noted that the carbonized layer needs to be peeled off before the display panel is bent.

Positions of the organic layer 131 and the carbonized layer can be adjusted by adjusting thicknesses of the first flexible layer 12 and the second flexible layer 14, thereby controlling a degree of thinning of the flexible base substrate. Furthermore, by thinning the flexible base substrate disposed below the bending area B, that is, by cutting the first flexible layer 12 and the carbonized layer disposed below the first setting area b, a bending neutral layer of the bending area B is adjusted to a same layer as a metal trace b1 or above the metal trace b1. Therefore, when the bending area B is bent, the metal trace b1 can be prevented from being damaged.

Figure 8:
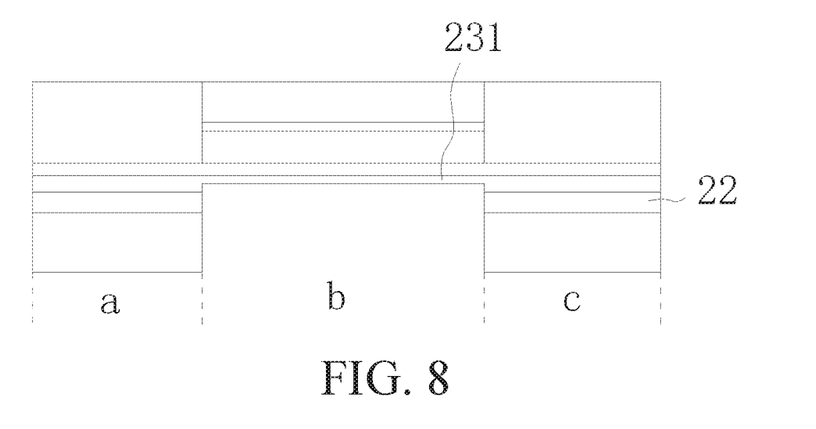
FIG. 8 is a cross-sectional side view of a display panel according to a second embodiment of the present disclosure.

Please refer to FIG. 8, which is a cross-sectional side view of a display panel according to a second embodiment of the present disclosure. A display panel of the second embodiment differs from that of the first embodiment in that the organic layer 231 of the spacer layer covers the entire first flexible layer 22, that is, covers the entire first setting area b, the second setting area a, and the third Set area c.

Figure 9:
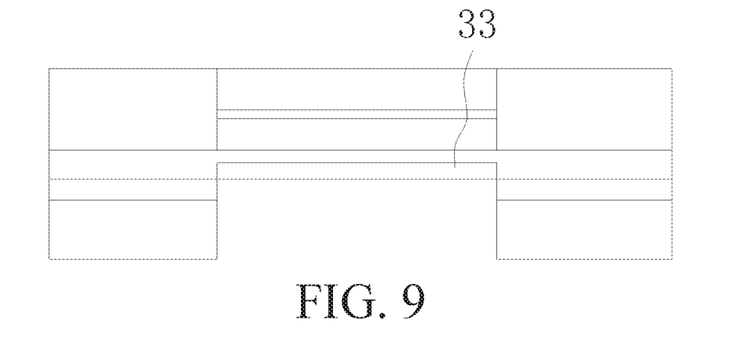
FIG. 9 is a cross-sectional side view of a display panel according to a third embodiment of the present disclosure.

Please refer to FIG. 9, which is a cross-sectional side view of a display panel according to a third embodiment of the present disclosure. A display panel of the third embodiment differs from that of the first embodiment in that the spacer layer 33 is a release film.

In the methods for fabricating the display panel according to the present disclosure, the first flexible layer and the second flexible layer are spaced apart by disposing the spacer layer between the first flexible layer and the second flexible layer. Further, the substrate and the first flexible layer in the first setting area are cut, thereby thinning thickness of a flexible base substrate in the first setting area. The method solves the technical problem that metal traces are easily damaged by stress when a bending radius of a bonding area of a current display panel is small.

In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A method for fabricating a display panel, wherein the display panel comprises a bending area, and the method comprises:
providing a substrate;
forming a first flexible layer on the substrate;
forming an organic layer on the first flexible layer, wherein a wavelength of light absorbed by the organic layer is different from a wavelength of light absorbed by the first flexible layer;
irradiating a part of the organic layer in the bending area with a laser to make at least a portion of the part of the organic layer a carbonized layer, thereby forming a spacer layer;
forming a second flexible layer covering the first flexible layer and the spacer layer, wherein the first flexible layer and the second flexible layer are made of a same material and separated by the spacer layer; and
cutting a part of the substrate and a part of the first flexible layer in the bending area.

2. The method for fabricating the display panel according to claim 1, wherein the spacer layer comprises the carbonized layer formed by oxidizing the organic layer by irradiating with the laser.

3. The method for fabricating the display panel according to claim 1, wherein a material of the organic layer is doped with dyes or nanoparticles configured to absorb light with a wavelength greater than 500 nm, and the first flexible layer and the second flexible layer are made of polyimide.

4. The method for fabricating the display panel according to claim 1, wherein the organic layer covers the entirety of the first flexible layer or only covers the part of the first flexible layer in the bending area.

5. The method for fabricating the display panel according to claim 1, wherein the cutting the part of the substrate and the part of the first flexible layer in the bending area comprises:
cutting and peeling off the part of the substrate in the bending area; and
cutting and peeling off the part of the first flexible layer in the bending area.

6. A method for fabricating a display panel, wherein the display panel comprises a bending area, and the method comprises:
providing a substrate;
forming a first flexible layer on the substrate;
forming an organic layer on the first flexible layer, wherein a wavelength of light absorbed by the organic layer is different from a wavelength of light absorbed by the first flexible layer;
cutting a part of the substrate in the bending area;
irradiating a part of the organic layer in the bending area with a laser to make at least a portion of the part of the organic layer a carbonized layer, thereby forming a spacer layer;
forming a second flexible layer covering the first flexible layer and the spacer layer; and
cutting a part of the first flexible layer in the bending area.

7. The method for fabricating the display panel according to claim 6, wherein the spacer layer comprises the carbonized layer formed by oxidizing the organic layer by irradiating with the laser.

8. The method for fabricating the display panel according to claim 6, wherein a material of the organic layer is doped with dyes or nanoparticles configured to absorb light with a wavelength greater than 500 nm, and the first flexible layer and the second flexible layer are made of a same material.

9. The method for fabricating the display panel according to claim 8, wherein the first flexible layer and the second flexible layer are made of polyimide.

10. The method for fabricating the display panel according to claim 6, wherein the organic layer covers the entirety of the first flexible layer or only covers the part of the first flexible layer in the first bending area.

11. The method for fabricating the display panel according to claim 6, wherein the cutting the part of the substrate and the part of the first flexible layer in the bending area comprises:
cutting and peeling off the part of the substrate in the bending area; and
cutting and peeling off the part of the first flexible layer in the bending area.

12. The method for fabricating the display panel according to claim 11, wherein the part of the substrate and the part of the first flexible layer in the bending area are cut with an ultraviolet laser at ends thereof.

13. The method for fabricating the display panel according to claim 6, wherein the cutting the part of the substrate and the part of the first flexible layer in the bending area comprises:
cutting and peeling off cut-out portions, wherein the cut-out portions are the part of the substrate and the part of the first flexible layer in the bending area.

* * * * *

UNITED STATES PATENT AND TRADEMARK OFFICE
CERTIFICATE OF CORRECTION

| | |
|---|---|
| PATENT NO. | : 11,325,351 B2 |
| APPLICATION NO. | : 16/605212 |
| DATED | : May 10, 2022 |
| INVENTOR(S) | : Hanning Yang |

It is certified that error appears in the above-identified patent and that said Letters Patent is hereby corrected as shown below:

On the Title Page

Item (73) Assignee:
"Wshan China Star Optoelectronics Semiconductor Display Technology Co., Ltd."
Should be changed to:
-- Wuhan China Star Optoelectronics Semiconductor Display Technology Co., Ltd. --

Signed and Sealed this
Fifteenth Day of November, 2022

Katherine Kelly Vidal
*Director of the United States Patent and Trademark Office*